(12) United States Patent
Greenlee et al.

(10) Patent No.: US 10,943,921 B2
(45) Date of Patent: *Mar. 9, 2021

(54) METHODS OF FORMING INTEGRATED ASSEMBLIES

(71) Applicant: Micron Technology, Inc., Boise, ID (US)

(72) Inventors: Jordan D. Greenlee, Boise, ID (US); Chet E. Carter, Boise, ID (US); Collin Howder, Meridian, ID (US); John Mark Meldrim, Boise, ID (US); Everett A. McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/751,116

(22) Filed: Jan. 23, 2020

(65) Prior Publication Data
US 2020/0161332 A1  May 21, 2020

Related U.S. Application Data

(60) Continuation of application No. 16/363,296, filed on Mar. 25, 2019, now Pat. No. 10,573,661, which is a
(Continued)

(51) Int. Cl.
| | |
|---|---|
| *H01L 27/11582* | (2017.01) |
| *H01L 21/3213* | (2006.01) |
| *H01L 29/10* | (2006.01) |
| *H01L 21/768* | (2006.01) |
| *H01L 23/532* | (2006.01) |
| *H01L 21/285* | (2006.01) |

(Continued)

(52) U.S. Cl.
CPC .. *H01L 27/11582* (2013.01); *H01L 21/28568* (2013.01); *H01L 21/32134* (2013.01); *H01L 21/76843* (2013.01); *H01L 21/76877* (2013.01); *H01L 23/5283* (2013.01); *H01L 23/53266* (2013.01); *H01L 27/11556* (2013.01); *H01L 29/1037* (2013.01); *H01L 29/40114* (2019.08); *H01L 29/40117* (2019.08); *H01L 27/11519* (2013.01); *H01L 27/11565* (2013.01); *H01L 29/4966* (2013.01); *H01L 29/4975* (2013.01)

(58) Field of Classification Search
None
See application file for complete search history.

(56) References Cited

U.S. PATENT DOCUMENTS 9,646,981 B2 * 5/2017 Nishikawa .......... H01L 27/1157
10,573,661 B2 * 2/2020 Greenlee ............ H01L 23/5283
(Continued)

*Primary Examiner* — Telly D Green
(74) *Attorney, Agent, or Firm* — Wells St. John P.S.

(57) ABSTRACT

Some embodiments include a method of forming an integrated structure. An assembly is formed to include a stack of alternating first and second levels. The first levels have insulative material, and the second levels have voids which extend horizontally. The assembly includes channel material structures extending through the stack. A first metal-containing material is deposited within the voids to partially fill the voids. The deposited first metal-containing material is etched to remove some of the first metal-containing material from within the partially-filled voids. Second metal-containing material is then deposited to fill the voids.

14 Claims, 15 Drawing Sheets

Related U.S. Application Data division of application No. 15/848,612, filed on Dec. 20, 2017, now Pat. No. 10,283,524.

(51) Int. Cl.
    *H01L 23/528*     (2006.01)
    *H01L 27/11556*     (2017.01)
    *H01L 21/28*     (2006.01)
    *H01L 29/49*     (2006.01)
    *H01L 27/11519*     (2017.01)
    *H01L 27/11565*     (2017.01)

(56) References Cited

U.S. PATENT DOCUMENTS

2015/0318299 A1* 11/2015 Lai .................... H01L 27/11582
    257/325
2016/0365351 A1* 12/2016 Nishikawa .......... H01L 27/1157
2018/0219017 A1     8/2018 Goda et al.

* cited by examiner

METHODS OF FORMING INTEGRATED ASSEMBLIES

RELATED PATENT DATA

This patent resulted from a continuation of U.S. patent application Ser. No. 16/363,296, filed Mar. 25, 2019, which resulted from a divisional of U.S. patent application Ser. No. 15/848,612, filed Dec. 20, 2017, now U.S. Pat. No. 10,283,524, which is hereby incorporated herein by reference.

TECHNICAL FIELD

Methods of filling horizontally-extending openings of integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 100 which includes a memory array 102 having a plurality of memory cells 103 arranged in rows and columns along with access lines 104 (e.g., wordlines to conduct signals WL0 through WLm) and first data lines 106 (e.g., bitlines to conduct signals BL0 through BLn). Access lines 104 and first data lines 106 may be used to transfer information to and from the memory cells 103. A row decoder 107 and a column decoder 108 decode address signals A0 through AX on address lines 109 to determine which ones of the memory cells 103 are to be accessed. A sense amplifier circuit 115 operates to determine the values of information read from the memory cells 103. An I/O circuit 117 transfers values of information between the memory array 102 and input/output (I/O) lines 105. Signals DQ0 through DQN on the I/O lines 105 can represent values of information read from or to be written into the memory cells 103. Other devices can communicate with the device 100 through the I/O lines 105, the address lines 109, or the control lines 120. A memory control unit 118 controls memory operations to be performed on the memory cells 103 utilizing signals on the control lines 120. The device 100 can receive supply voltage signals Vcc and Vss on a first supply line 130 and a second supply line 132, respectively. The device 100 includes a select circuit 140 and an input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103. The column decoder 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

The memory array 102 of FIG. 1 may be a NAND memory array, and FIG. 2 shows a block diagram of a three-dimensional NAND memory device 200 which may be utilized for the memory array 102 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Three-dimensional integrated structures (e.g., three-dimensional NAND) may have vertically-stacked wordline levels. It can be difficult to uniformly deposit conductive material within the wordline levels. It would be desirable to develop methods for providing conductive material within the wordline levels.

DETAILED DESCRIPTION OF THE ILLUSTRATED EMBODIMENTS

Some embodiments include new methods for depositing conductive wordline material within assemblies comprising vertically-stacked memory cells (e.g., three-dimensional NAND memory arrays). Some embodiments include new structures formed utilizing the new methods described herein. Example embodiments are described with reference to FIGS. 5, 6 and 8-13. FIG. 7 is provided to illustrate a prior art process stage for comparison relative to methods of the present invention.

Figure 1:
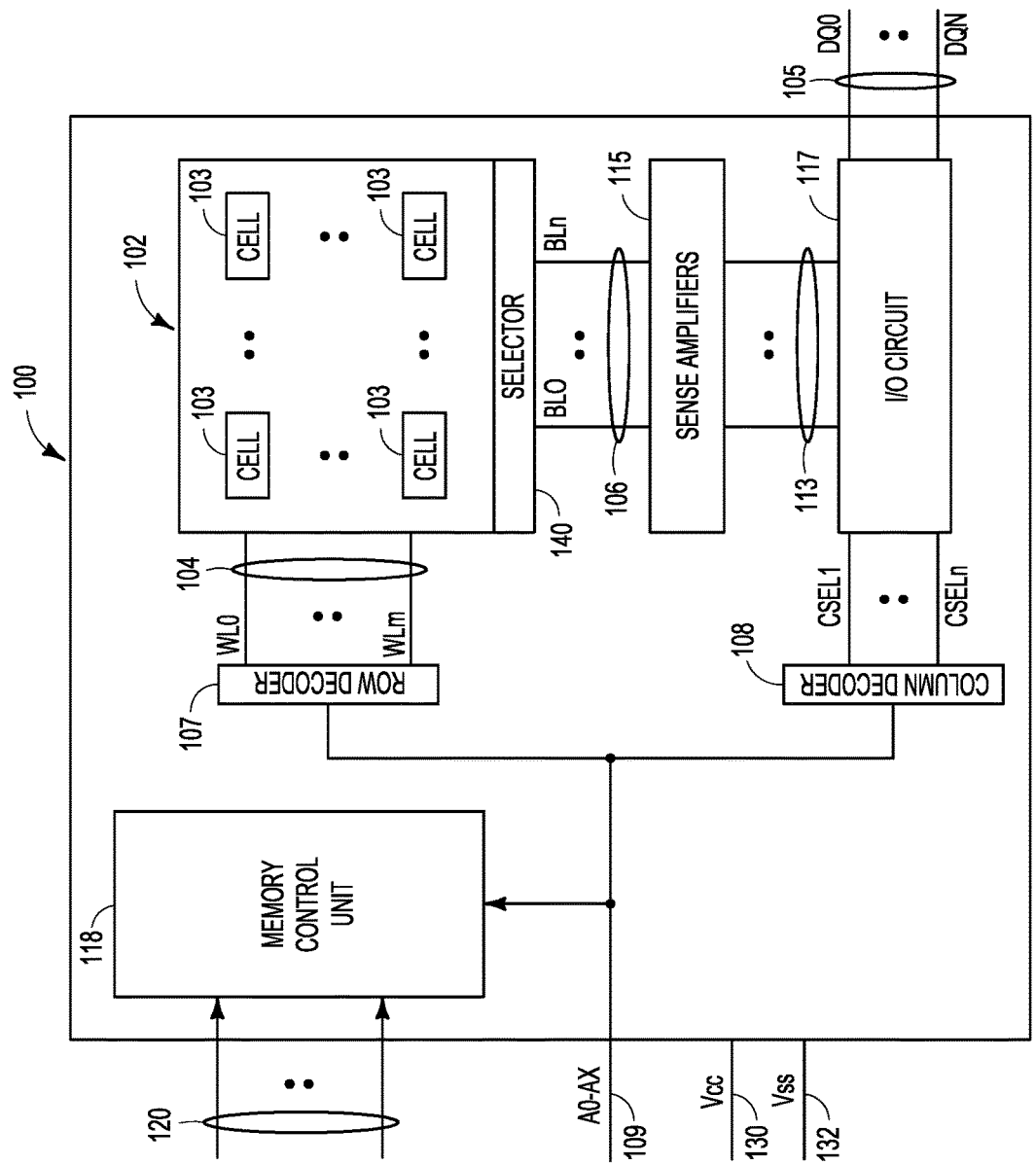
FIG. 1 shows a block diagram of a prior art memory device having a memory array with memory cells.
Figure 2:
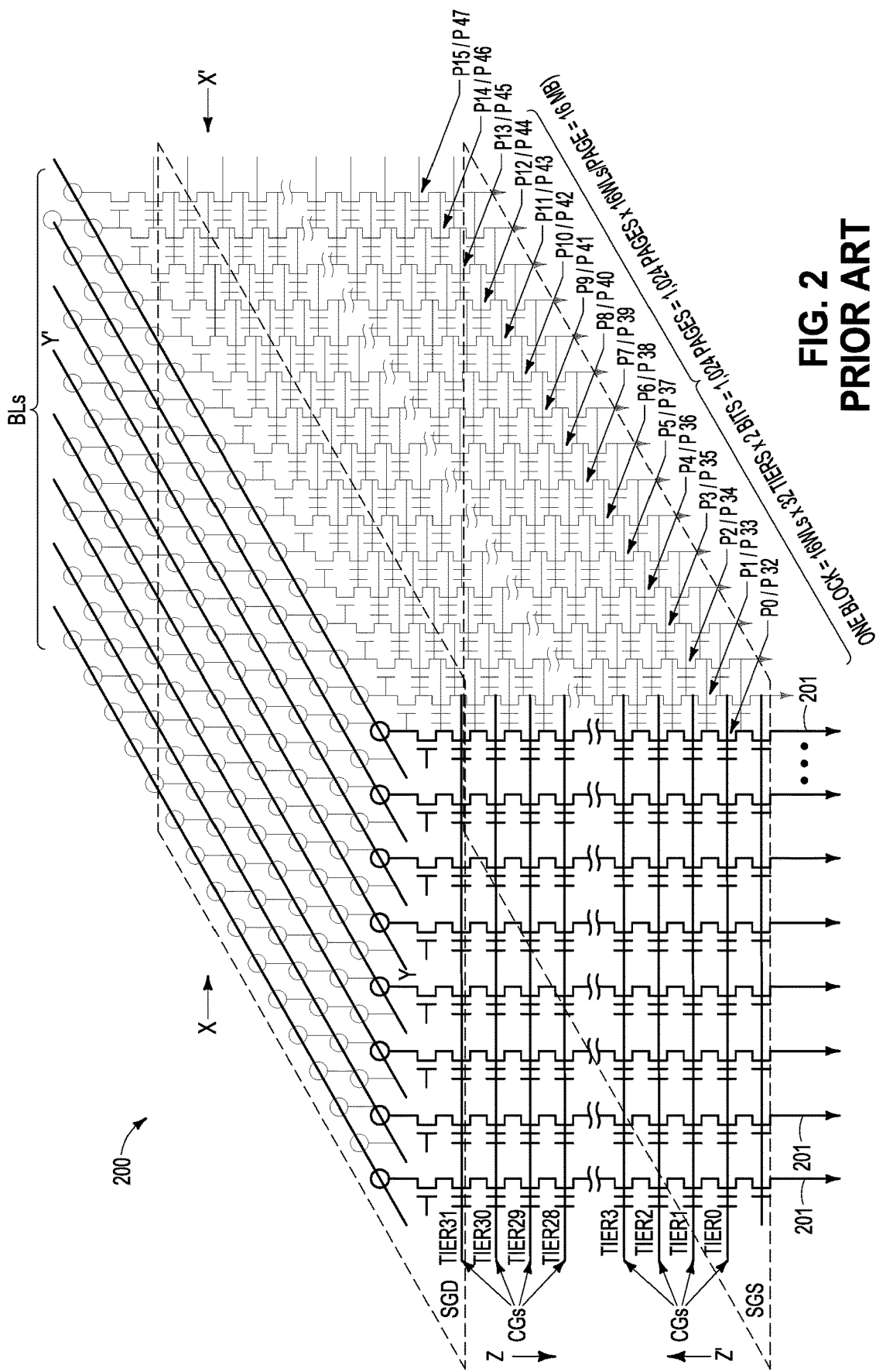
FIG. 2 shows a schematic diagram of the prior art memory array of FIG. 1 in the form of a 3D NAND memory device.
Figure 3:
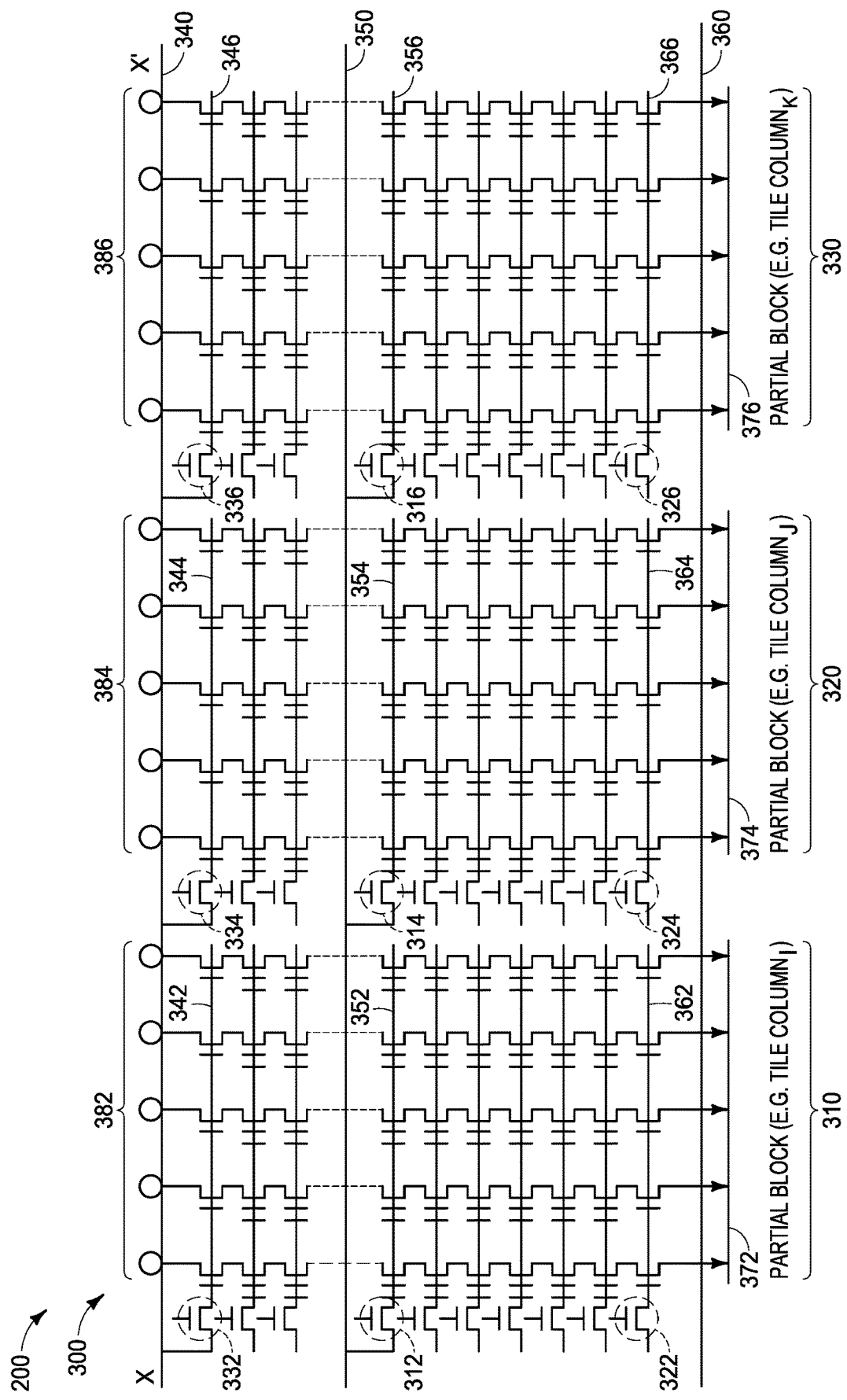
FIG. 3 shows a cross sectional view of the prior art 3D NAND memory device of FIG. 2 in an X-X' direction.
Figure 4:
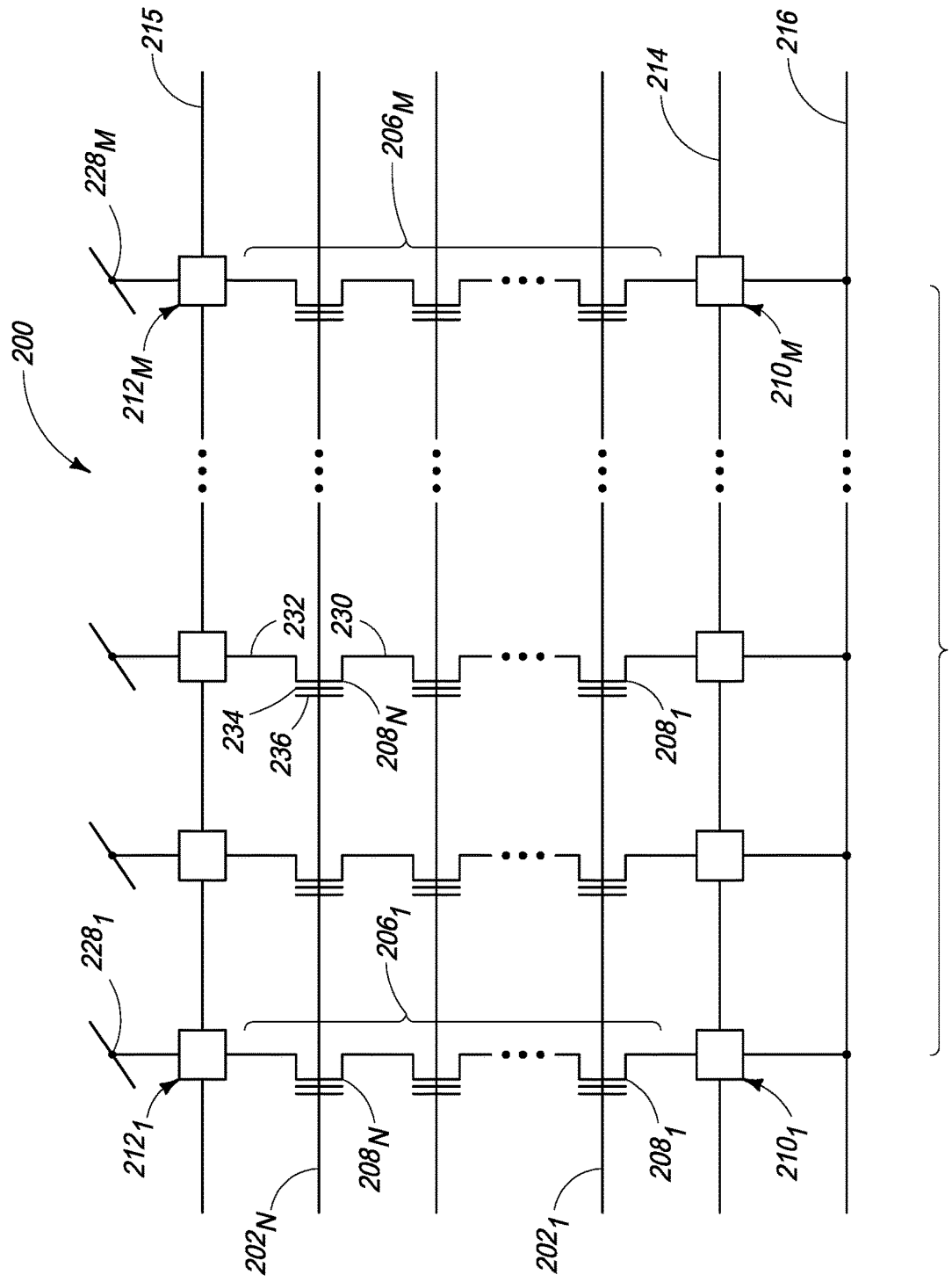
FIG. 4 is a schematic of a prior art NAND memory array.
Figure 5:
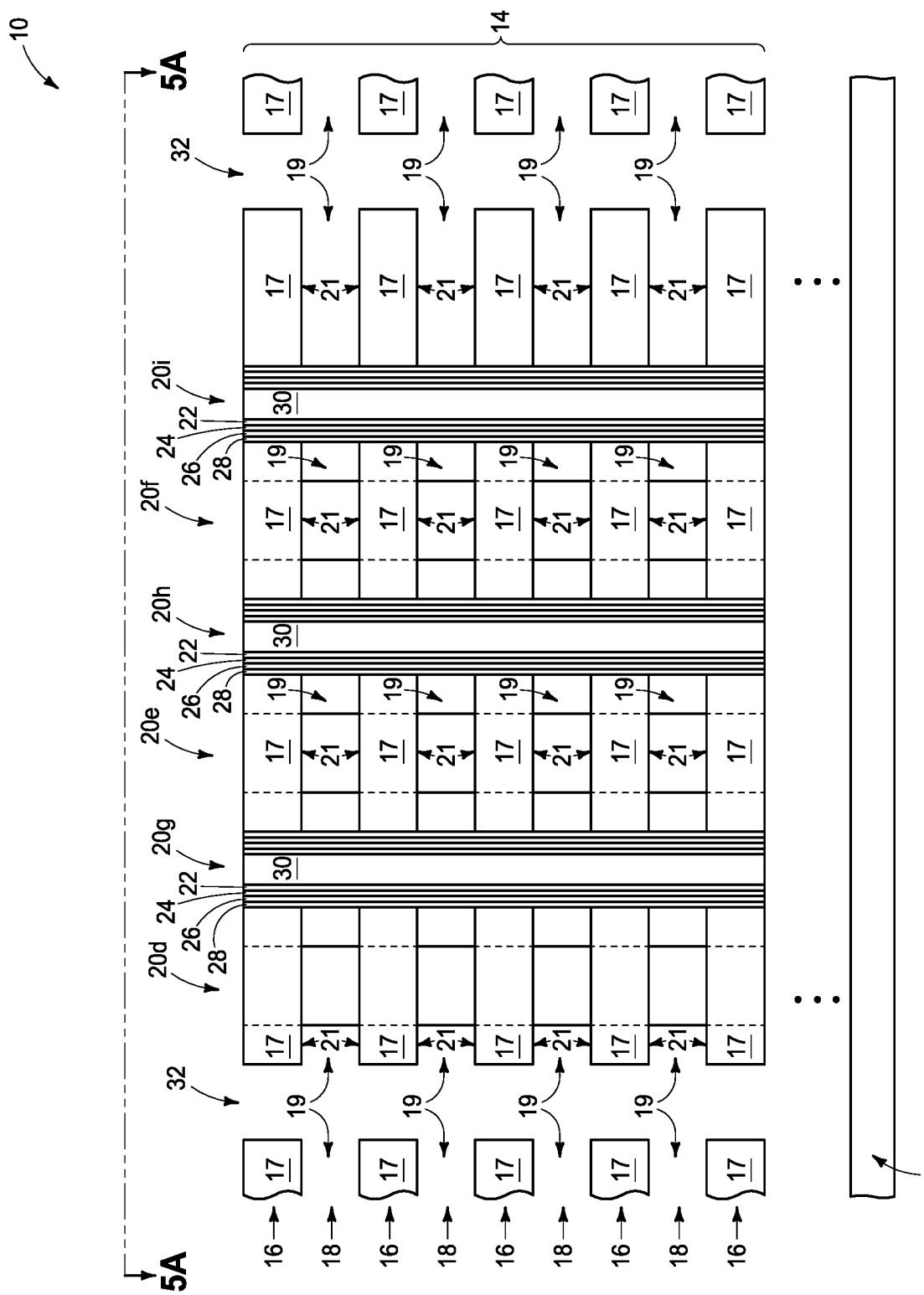
FIGS. 5 and 6 are diagrammatic cross-sectional views of an example assembly at process stages relative to an example method for fabricating example stacked memory cells.
Figure 5A:
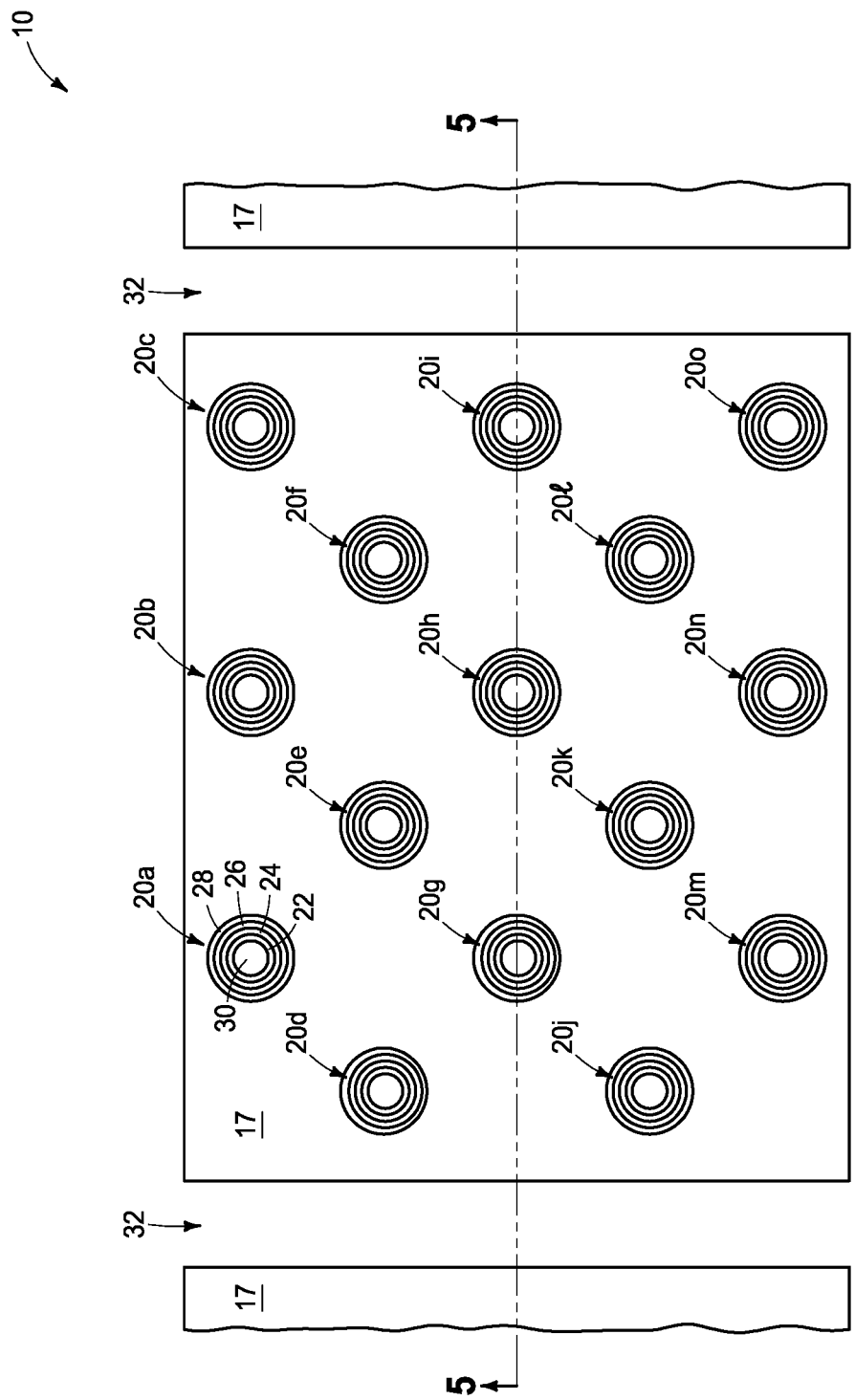
FIG. 5A is a top view of the assembly of FIG. 5. The cross-section of FIG. 5 is along the line 5-5 of FIG. 5A; and the view of FIG. 5A is along the line 5A-5A of FIG. 5.

Referring to FIGS. 5 and 5A, a construction 10 (which may also be referred to as an integrated assembly, or as an integrated structure) includes a stack 14 of alternating first and second levels 16 and 18.

The first levels 16 comprise insulative material 17, and the second levels 18 comprise voids 19. The levels 16 and 18 may be of any suitable thicknesses. The levels 16 may be of different thicknesses than the levels 18, or may be the same thicknesses as the levels 18.

The insulative material 17 may comprise any suitable composition or combination of compositions; and in some embodiments may comprise, consist essentially of, or consist of silicon dioxide.

Ultimately, conductive wordlines (discussed below) are formed within the second levels 18, and such wordlines comprise control gates for memory cells. In some embodiments, the levels 18 may be referred to as memory cell levels of a NAND configuration. The NAND configuration can include a string of memory cells (a so-called NAND string), with the number of memory cells in the string being determined by the number of memory cell levels 18. The NAND string may comprise any suitable number of memory cell levels. For instance, the NAND string may have 8 memory cell levels, 16 and memory cell levels, 32 memory cell levels, 64 memory cell levels, 512 memory cell levels, 1024 memory cell levels, etc.

Structures 20a-o extend through the stack 14. The structures 20a-o may be referred to as channel material structures in that they comprise channel material 22. The channel material 22 comprises semiconductor material; and may comprise any suitable composition or combination of compositions. For instance, the channel material 22 may comprise one or more of silicon, germanium, III/V semiconductor materials (e.g., gallium phosphide), semiconductor oxides, etc.

Tunneling material (sometimes referred to as gate dielectric) 24, charge-storage material 26 and charge-blocking material 28 are between the channel material 22 and the vertically-stacked levels 16/18. The tunneling material, charge-storage material and charge-blocking material may comprise any suitable compositions or combinations of compositions.

In some embodiments, the tunneling material 24 may comprise, for example, one or more of silicon dioxide, aluminum oxide, hafnium oxide, zirconium oxide, etc.

In some embodiments, the charge-storage material 26 may comprise charge-trapping materials, such as silicon nitride, silicon oxynitride, conductive nanodots, etc. In alternative embodiments (not shown), charge-storage material 26 may be configured as floating gate material (such as, for example, polycrystalline silicon).

In some embodiments, the charge-blocking material 28 may comprise one or more of silicon dioxide, aluminum oxide, hafnium oxide, zirconium oxide, etc.

In the illustrated embodiment, the channel material 22 is configured as annular rings within each of the structures 20a-o. Insulative material 30 fills such annular rings. The insulative material 30 may comprise any suitable composition or combination of compositions, such as, for example, silicon dioxide. The illustrated structures 20 may be considered to comprise hollow channel configurations, in that the insulative material 30 is provided within "hollows" in the annular ring-shaped channel configurations. In other embodiments (not shown), the channel material may be configured as a solid pillar configuration.

The channel material structures 20a-o may be considered to comprise all of the materials 22, 24, 26, 28 and 30 in combination. The top view of FIG. 5A shows that the channel material structures 20a-o may be arranged in a hexagonally-packed pattern.

Slits 32 extend through the stack 14. The slits 32 provide access to all of the voids 19 so that such voids may be filled with conductive material during subsequent processing (described below). In some embodiments, the voids 19 may be considered to open into the slits 32.

The voids 19 weave around the channel material structures 20a-0. Accordingly, all of the voids 19 along the cross-sectional view of FIG. 5 may be fully accessed through the illustrated slits 32. The plane of the FIG. 5 cross-section cuts through the channel material structures 20g-i. The channel material structures 20d-f are out of the plane of the FIG. 5 cross-section (specifically, are a row of the structures 20 immediately behind the plane), but are shown in FIG. 5 to assist in illustrating that the voids 19 weave between the channel material structures. Some regions of the channel material structures 20d-f are behind material 17, and shown in dashed line (i.e., phantom) view; while other regions of the channel material structures 20d-f are visible through voids 19 and shown in solid line.

The voids 19 may be considered to comprise peripheral regions 21 (which may also be referred to as edges or boundaries).

In some embodiments, the stack 14 may be considered to be a vertically-extending stack, and the insulative layers of levels 16 may be considered to extend horizontally. The voids 19 may be considered to be horizontally-extending voids which are vertically between the horizontally-extending insulative levels.

The stack 14 is over a supporting base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is shown between the base 12 and the stack 14 to diagrammatically indicate that there may be one or more additional materials, components, etc., provided between the base 12 and the stack 14. Such additional components may include, for example, conductive source lines, select gates, etc.

The stack 14 of FIG. 5 may be formed with any suitable processing. An example process may comprise initially forming sacrificial material within the levels 18 (such sacrificial material may be silicon nitride in some example embodiments), and then removing the sacrificial material after forming the channel material structures 20 and the slits 32 to leave the construction of FIG. 5.

Figure 6:
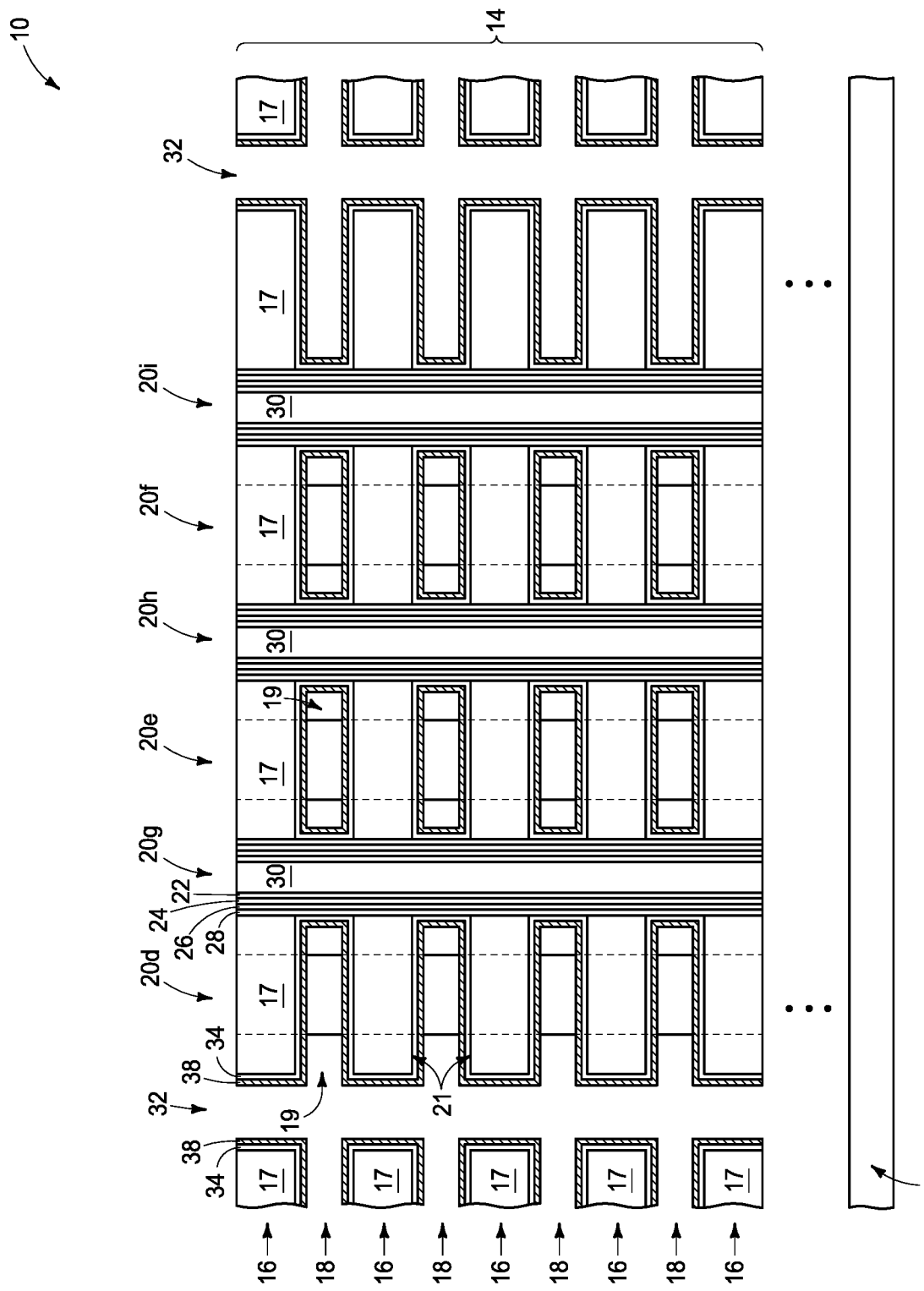
Figure 7:
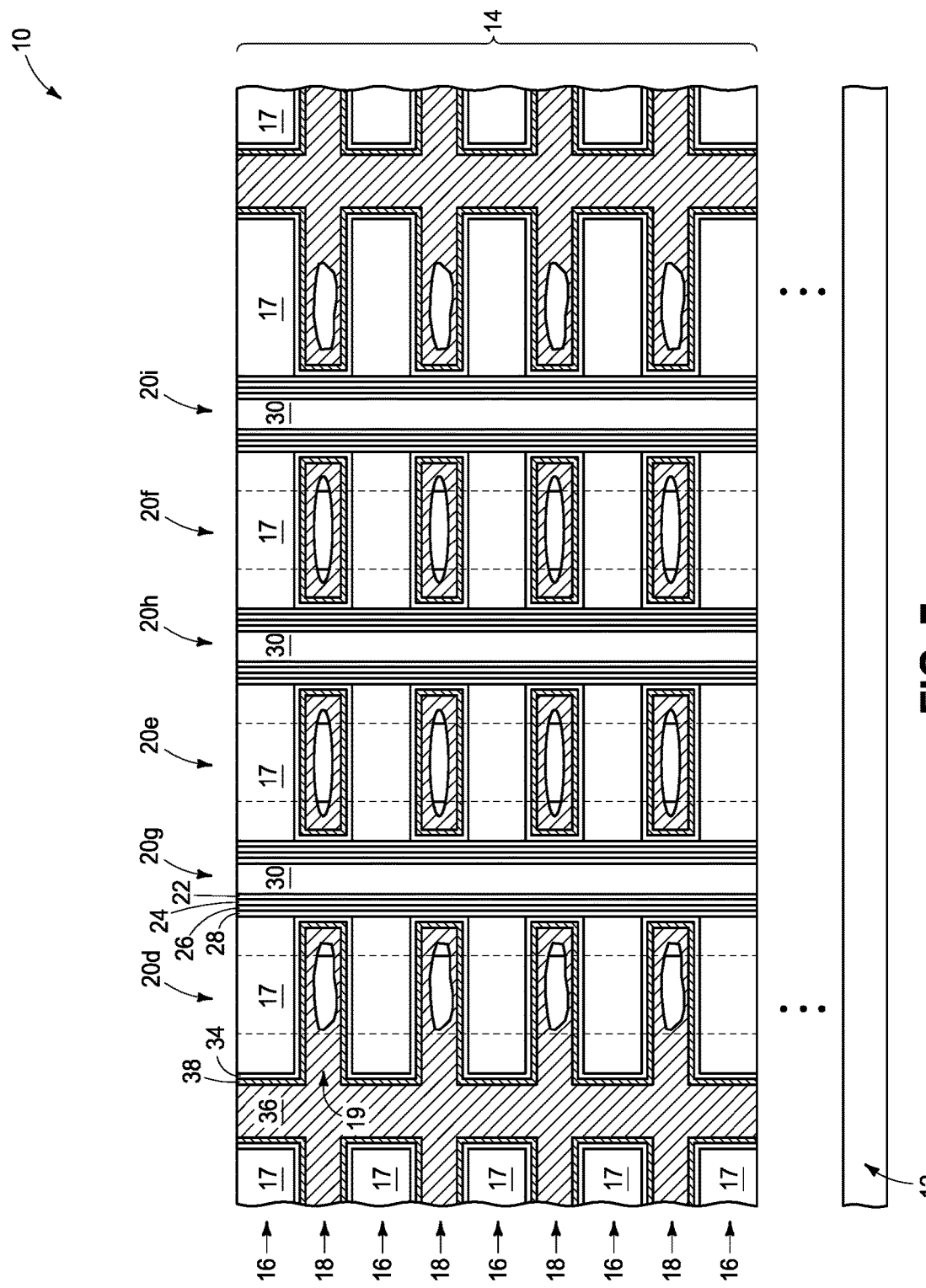
FIG. 7 is a diagrammatic cross-sectional view of a prior art assembly at a process stage following the process stage of FIG. 6.

Referring to FIG. 6, insulative material 34 is deposited along the peripheral boundaries 21 of the voids 19. The material 34 may comprise additional charge-blocking material; and may comprise any suitable composition or combination of compositions. In some embodiments, the material 34 may comprise high-k material (for instance, one or more of aluminum oxide, hafnium oxide, zirconium oxide, tantalum oxide, etc.); where the term "high-k" means a dielectric constant greater than that of silicon dioxide. Although the insulative material 34 is shown to be a single homogenous material, in other embodiments the insulative material may comprise two or more discrete compositions. For instance, in some embodiments the insulative material 34 may comprise a laminate of silicon dioxide and one or more high-k materials. In some embodiments, the material 34 may be considered to form liners within the voids 19. In some embodiments, the charge-blocking material 28 may be omitted, so that the material 34 is the only charge-blocking material provided within the assembly of construction 10.

The insulative material 34 may be formed by flowing appropriate precursors through the slits 32 in a deposition process (for instance, an atomic layer deposition process, a chemical vapor deposition process, etc.).

A conductive liner material (seed material) 38 is provided over the insulative material 34. In some embodiments, the conductive liner material 38 may comprise a metal nitride; such as, for example, tungsten nitride, titanium nitride, etc.

In subsequent processing, conductive material is provided to fill the voids 19 and form conductive wordlines. However, it is found to be difficult to uniformly fill the voids utilizing conventional processes. FIG. 7 shows construction 10 at a processing stage of a prior art process, and illustrates a problem encountered in attempting to fill the voids 19 with a conductive material 36 utilizing conventional processing. Specifically, the conductive material 36 may pinch-off regions of the voids along the slits 32 before the voids are completely filled with the conductive material. Accordingly, some regions of the voids 19 are not uniformly filled. Such may problematically lead to reduced conductance (i.e., increased resistance) along the conductive wordlines, to excess power being utilized by memory fabricated within the assembly of construction 10, to excess heat generated during utilization of memory fabricated within the assembly of construction 10; and may even lead to device failure.

Some embodiments include methodology which may be utilized to more uniformly deposit conductive material within the voids 19 than is achieved utilizing conventional methodology.

Figure 8:
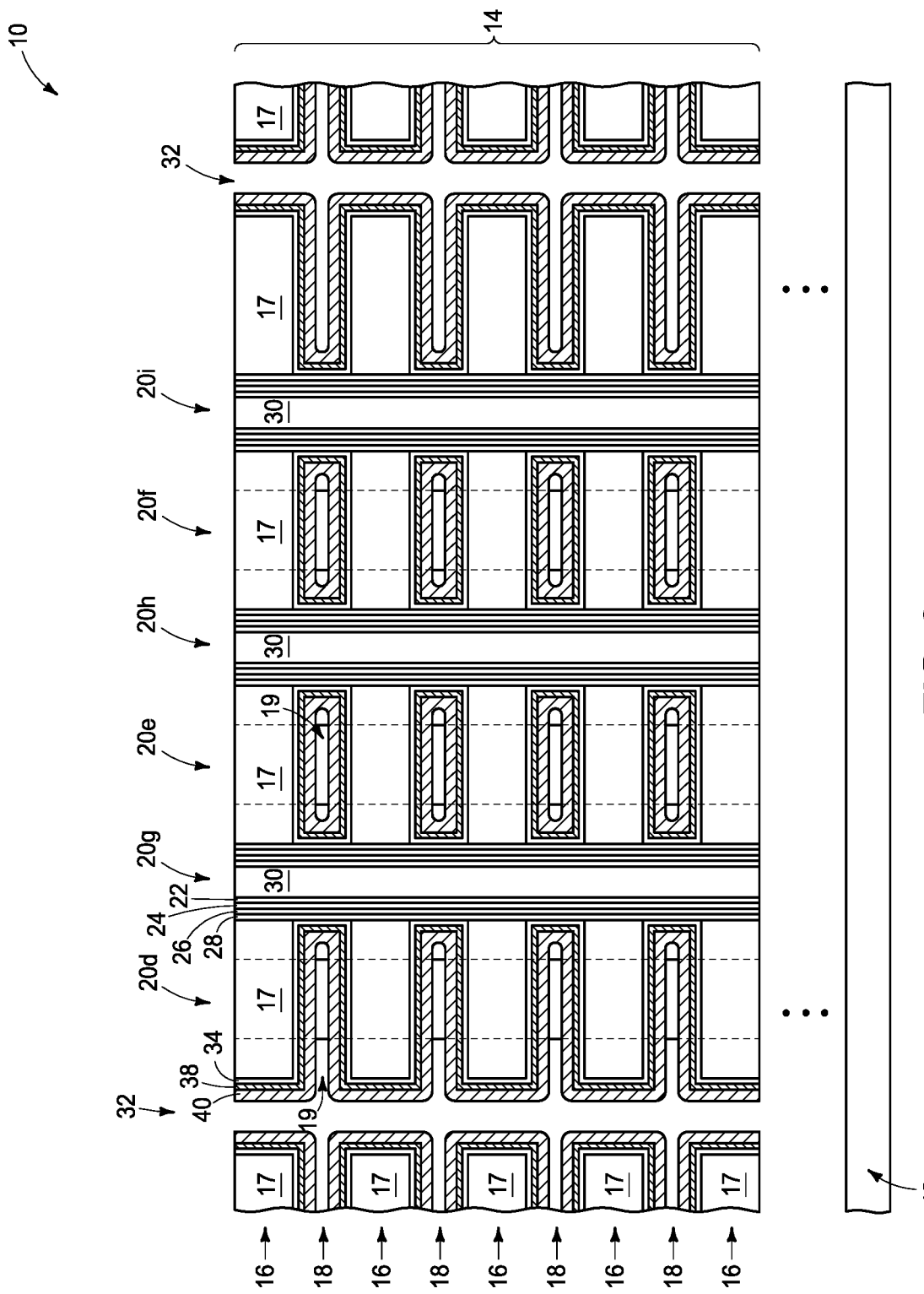
FIGS. 8-13 are diagrammatic cross-sectional views of an example assembly at process stages following the process stage of FIG. 6 relative to an example method for fabricating example stacked memory cells.

Referring to FIG. 8, such shows construction 10 at a processing stage following that of FIG. 6 in accordance with an example embodiment. A first material 40 is deposited within the voids 19 under conditions which partially fill the voids. The first material 40 may be a conductive material, and may be referred to as a first conductive material. The first conductive material 40 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, metal aluminum silicide, etc.), and/or conductively-doped semiconductor materials (e.g., conductively-doped silicon, conductively-doped germanium, etc.). In some embodiments, the first conductive material 40 may be a metal-containing material, and may be referred to as a first metal containing material. In some embodiments, the material 40 may comprise, consist essentially of, or consist of one or more metals selected from the group consisting of tungsten, titanium, ruthenium, nickel, molybdenum and cobalt. In some embodiments, the material 40 may include one or more of tungsten, titanium, ruthenium, nickel, molybdenum and cobalt; and may further include one or more of nitrogen, aluminum, silicon, oxygen, carbon and germanium. In some embodiments, the material 40 may comprise, consist essentially of, or consist of metal nitride (for instance, one or more of tungsten nitride, titanium nitride, etc.).

The first material 40 may be formed with any suitable processing. For instance, in some embodiments the first material 40 may be deposited utilizing one or both of atomic layer deposition (ALD) and chemical vapor deposition (CVD) by flowing appropriate compositions through the slits and into the voids 19. In some embodiments, it is found to be particularly beneficial to utilize ALD during formation of the first material 40 within the voids 19, as it is found that ALD may form a desired substantially uniform layer of the material 40 throughout the voids 19. In some embodiments, the material 40 may be considered to be grown along exposed surfaces of the conductive seed material 38.

Figure 9:
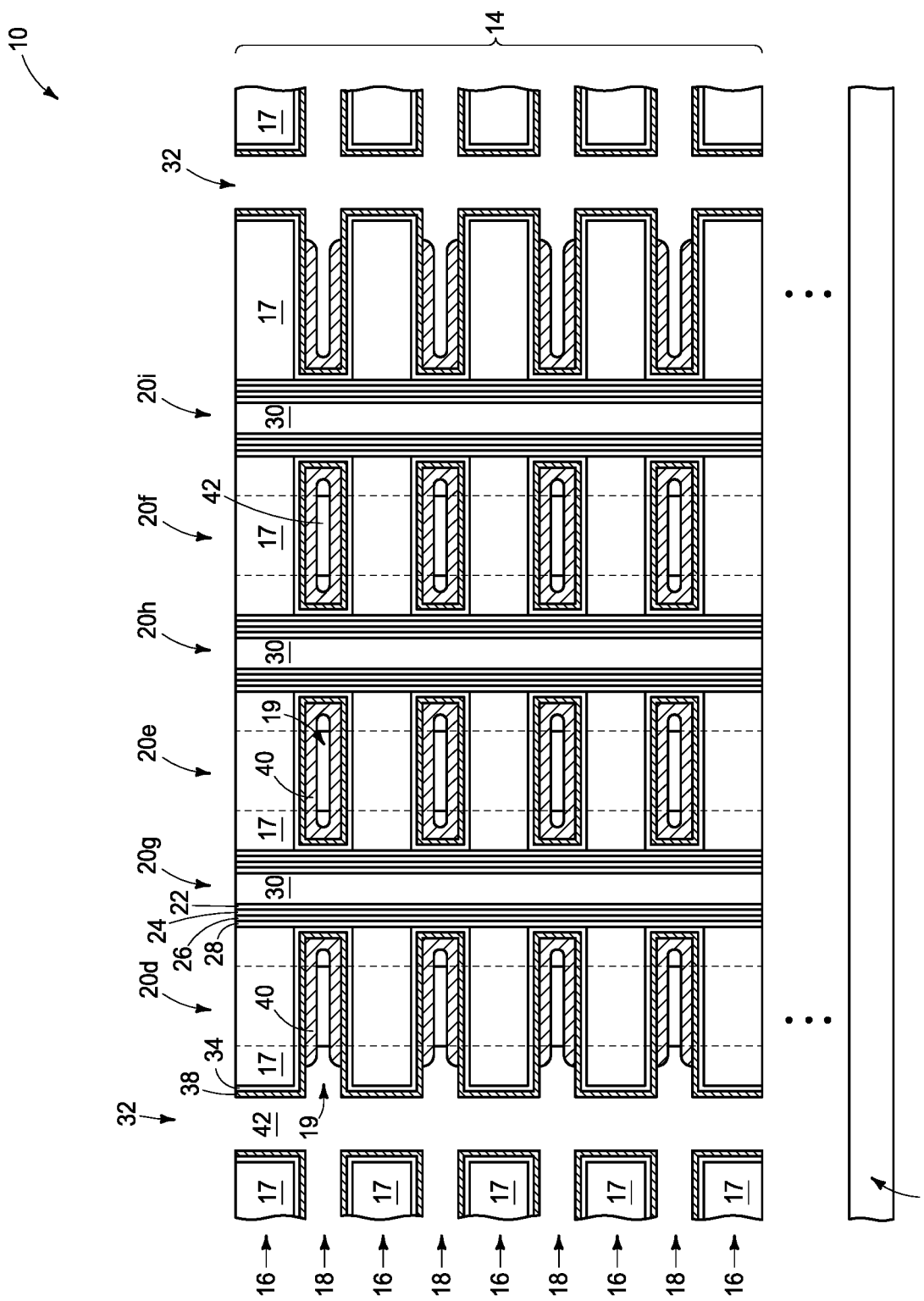

Referring to FIG. 9, etching is utilized to remove some of the first material 40 from along the slits 32, and from within the partially-filled voids 19. Accordingly, to the extent that the material 40 is starting to pinch-off the voids in the problematic manner described above with reference to the prior art FIG. 7, the problem is alleviated by removing the material 40 from within regions of the voids where such pinch-off is most likely to occur (i.e., from regions of the voids adjacent the slits 32).

The etching of material 40 may utilize any suitable chemistry and conditions. In some embodiments, material 40 is a metal-containing material comprising one or more of tungsten, titanium, ruthenium, cobalt, nickel and molybdenum. The etching conditions may utilize one or more of phosphoric acid, acetic acid and nitric acid; and may be conducted while the etchant is at a temperature within a range of from about 60° C. to about 100° C. The etching may be conducted under atmospheric pressure, or under any other suitable pressure. The etching may be conducted for a suitable duration to remove a desired amount of the material 40, and such duration may be related to the particular configuration of assembly 10, the particular dimensions of the voids 19, the composition of material 40, etc. Persons of ordinary skill in the art can determine the appropriate duration for particular assemblies.

Figure 10:
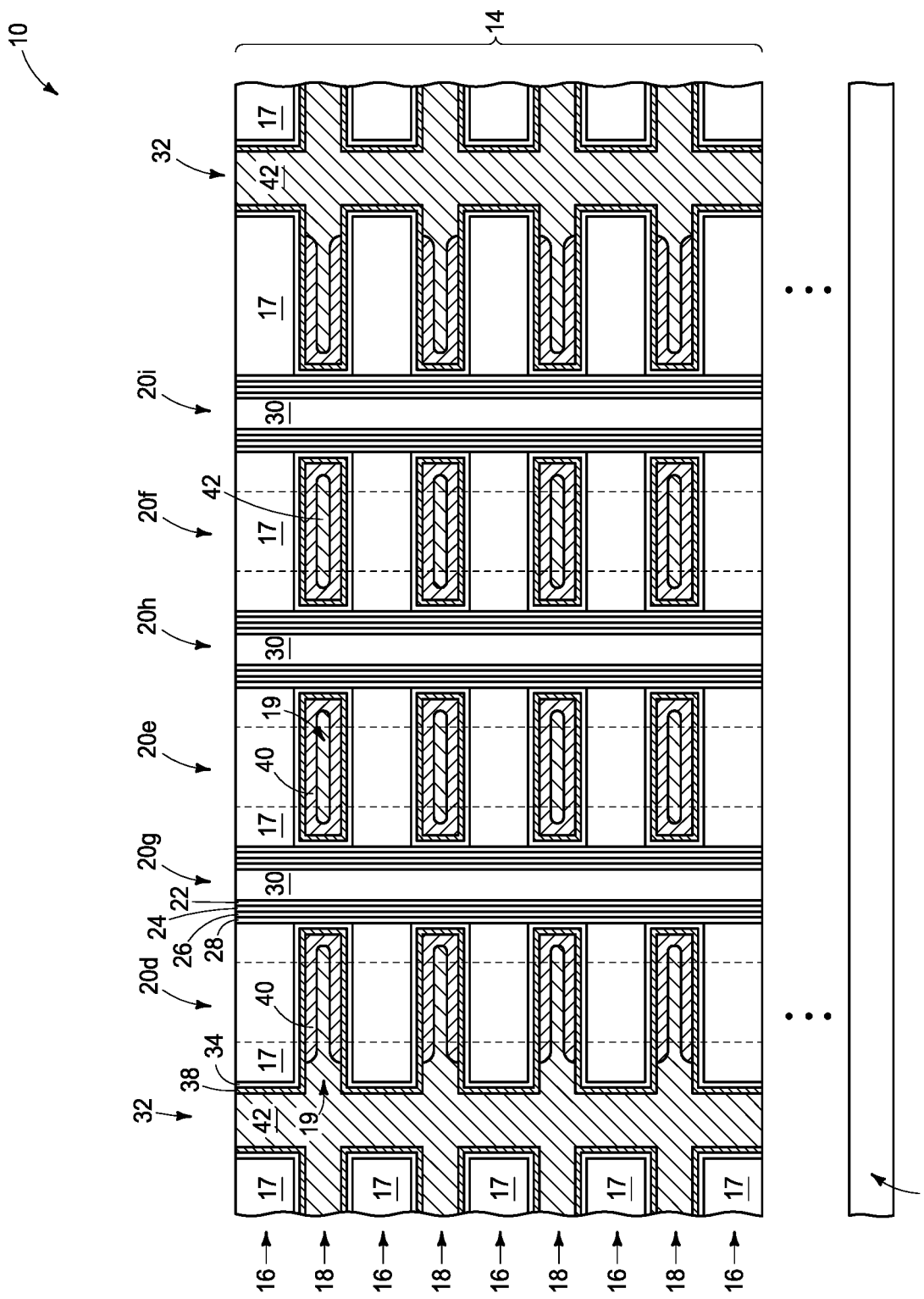

Referring to FIG. 10, a material 42 is deposited to fill the voids 19. In some embodiments, the voids 19 may be considered to be partially filled with the material 40 after the etching of FIG. 9, and to have remaining unfilled portions. The material 42 may be considered to fill such remaining portions of the voids 19.

The material 42 may be a conductive material, and may be referred to as a second conductive material. The second conductive material 42 may comprise any suitable composition(s), such as, for example, one or more of various metals (e.g., titanium, tungsten, cobalt, nickel, platinum, ruthenium, etc.), metal-containing compositions (e.g., metal silicide, metal nitride, metal carbide, metal aluminum silicide, etc.), and/or conductively-doped semiconductor materials (e.g., conductively-doped silicon, conductively-doped germanium, etc.). In some embodiments, the second conductive material 42 may be a metal-containing material, and may be referred to as a second metal containing material. In some embodiments, the material 42 may comprise, consist essentially of, or consist of one or more metals selected from the group consisting of tungsten, titanium, ruthenium, nickel, molybdenum and cobalt. In some embodiments, the material 42 may include one or more of tungsten, titanium, ruthenium, nickel, molybdenum and cobalt; and may further include one or more of nitrogen, aluminum, silicon, oxygen, carbon and germanium. In some embodiments, the material 42 may comprise, consist essentially of, or consist of metal nitride (for instance, one or more of tungsten nitride, titanium nitride, etc.).

The first and second materials 40 and 42 may comprise a same composition as one another in some embodiments; and in other embodiments may comprise different compositions relative to one another. For instance, in some embodiments the first and second materials 40 and 42 may both comprise, consist essentially of, or consist of tungsten. In some embodiments, the first material 40 may comprise, consist essentially of, or consist of one or more of titanium nitride, tungsten nitride and titanium aluminum silicide; and the second material 42 may comprise, consist essentially of, or consist of tungsten.

The second material 42 may be deposited under any suitable conditions. In some embodiments, the second material 42 may be considered to be grown over the first material 40. In some embodiments, the second material 42 may be deposited utilizing one or more of ALD, CVD and physical vapor deposition (PVD).

In some embodiments, the first material 40 may be deposited with a first process selected from the processes of ALD, CVD and PVD; and the second material 42 may be deposited with a second process selected from the processes of ALD, CVD and PVD. The first and second processes may be the same as one another, or may be different relative to one another.

Figure 11:
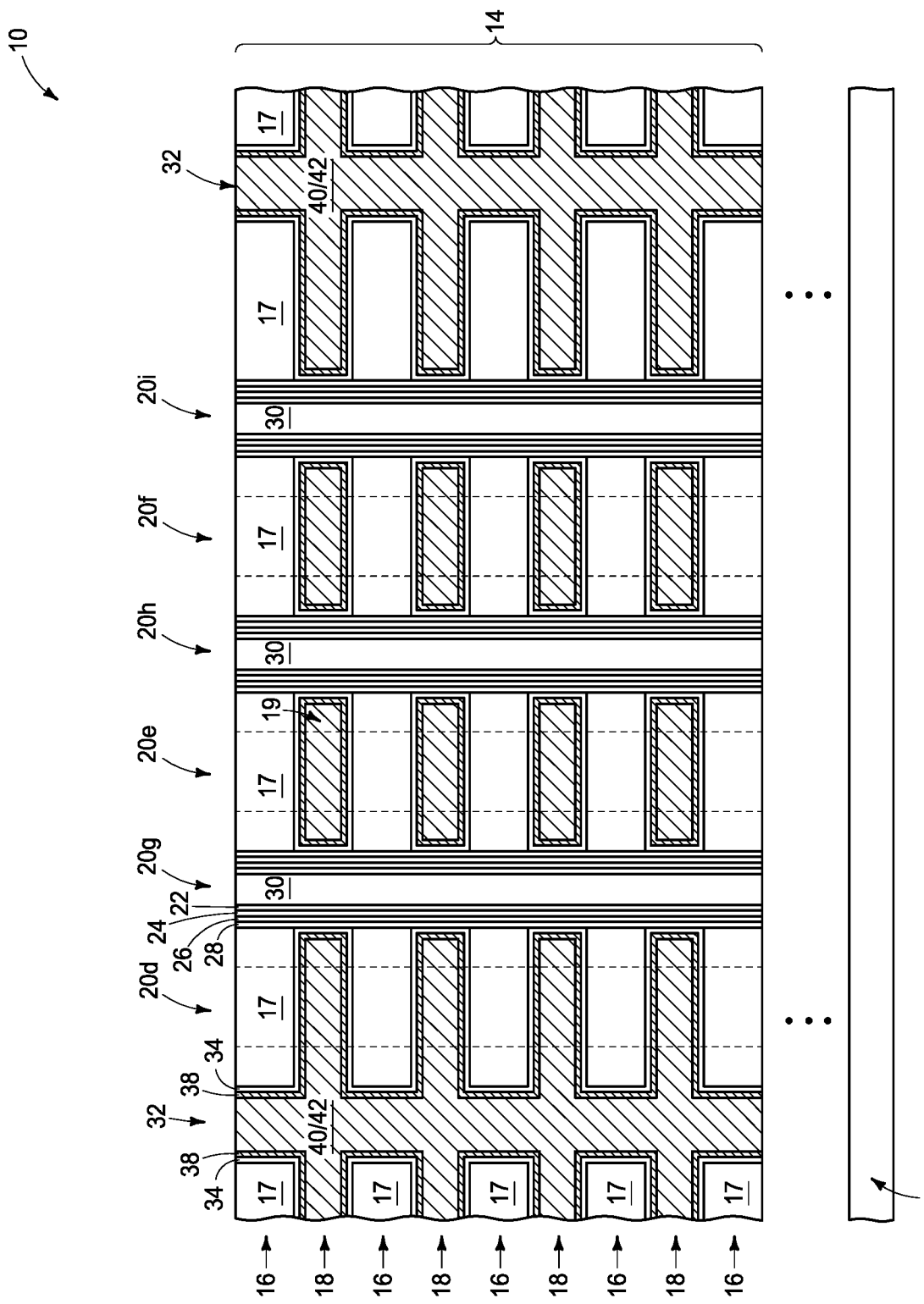

FIG. 10 schematically illustrates the second material 42 being different from the first material 40 to emphasize that the first and second materials 40 and 42 may be different from one another in some embodiments. FIG. 11 shows construction 10 at a processing stage identical to that of FIG. 10, but shows the materials 40 and 42 merging into a single material 40/42. The materials 40 and 42 may merge into a single material if the materials 40 and 42 comprise a same composition as one another. The construction of FIG. 11 comprising the merged materials 40/42 will be used as the basis for the remaining figures of this disclosure (FIGS. 12 and 13) as such simplifies the figures as compared to utilizing the construction of FIG. 10 with the separate materials 40 and 42. However, it is to be understood that the process stages of FIGS. 12 and 13 may also be applied relative to applications in which the materials 40 and 42 are different from one another.

The processing sequences of FIGS. 8-11 describe a deposition-etch-deposition sequence in which the first material 40 is deposited, then etched, and then the second material 42 is deposited. In other embodiments, such sequence may be one iteration of a process utilizing two or more of the sequences. For instance, other embodiments may utilize deposition-etch-deposition-etch-deposition processes, deposition-etch-deposition-etch-deposition-etch-deposition processes, etc.

Figure 12:
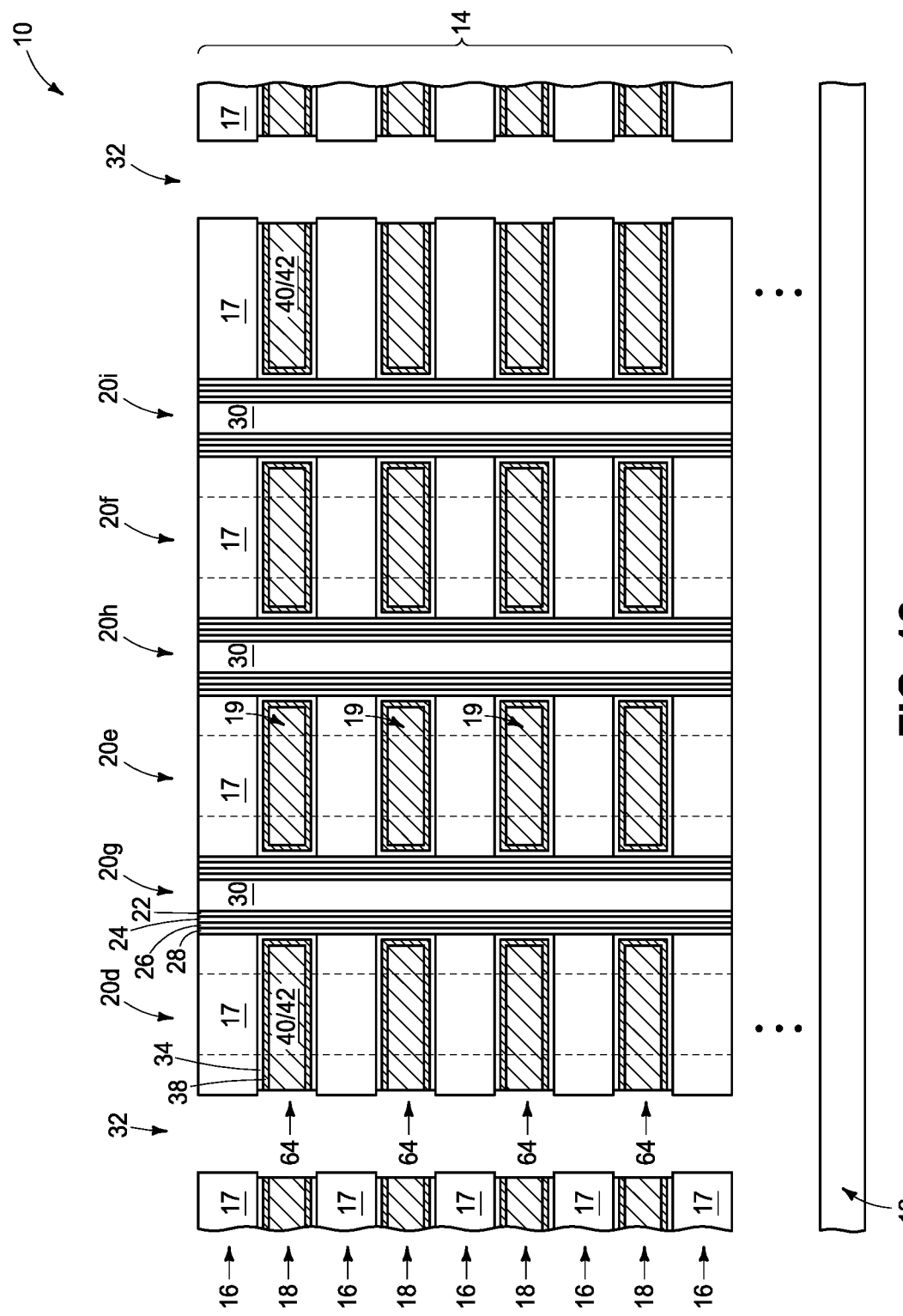

Referring to FIG. 12, the conductive material 40/42 is removed from slits 32 with one or more suitable etches. The remaining conductive material 40/42 forms conductive wordlines 64 along the second levels 18.

Figure 13:
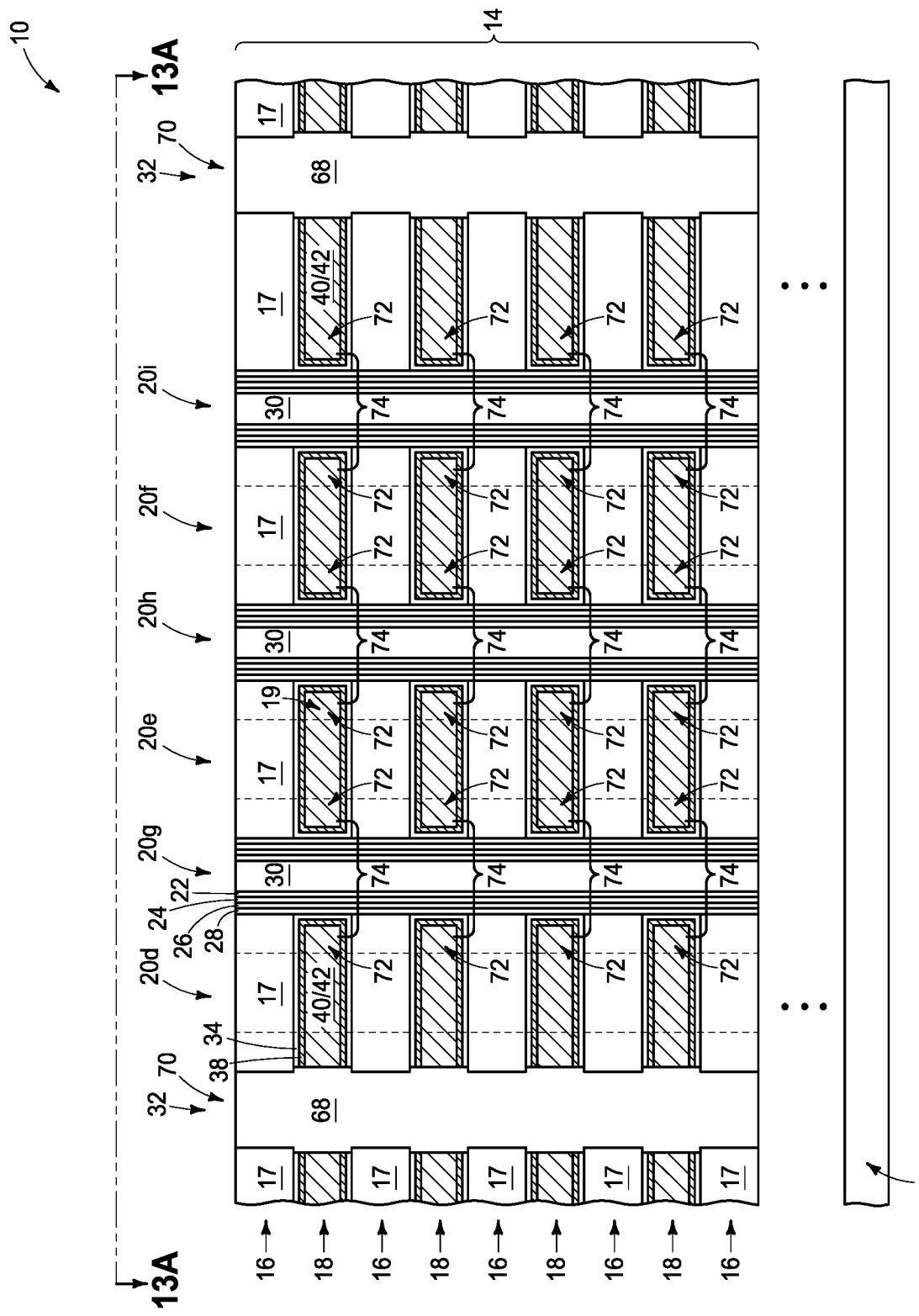
Figure 13A:
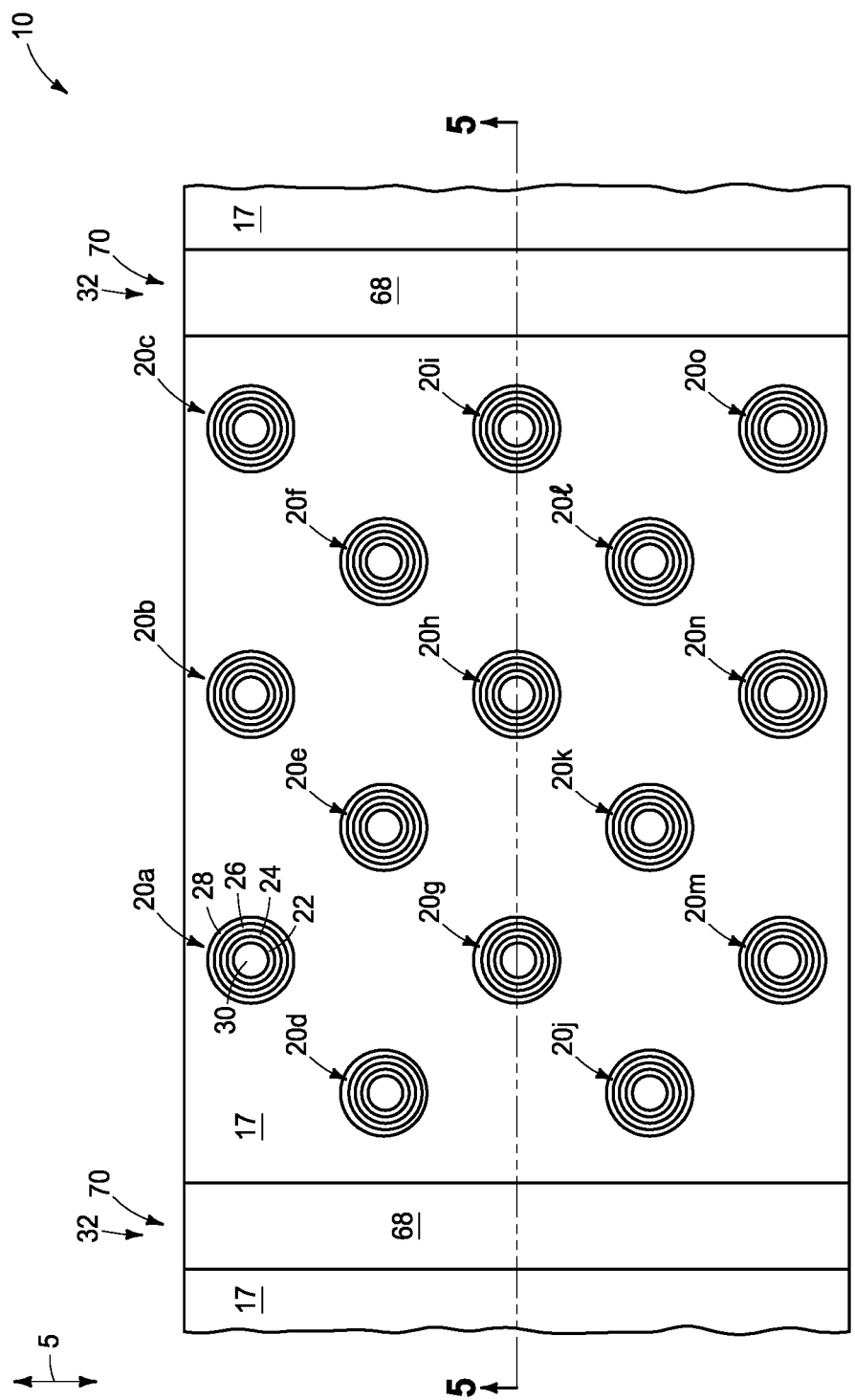
FIG. 13A is a top view of the assembly of FIG. 13. The cross-section of FIG. 13 is along the line 13-13 of FIG. 13A; and the view of FIG. 13A is along the line 13A-13A of FIG. 13.

Referring to FIGS. 13 and 13A, the slits 32 are filled with insulative material 68. The insulative material 68 within the slits is configured as panels 70 which extend longitudinally along an axis 5 (provided adjacent the top view of FIG. 13A).

The wordlines 64 comprise gate regions 72 adjacent the channel material structures 20g-i along the plane of FIG. 13; and the gate regions together with materials in the channel material structures form a plurality of vertically-stacked memory cells 74 along the plane of FIG. 13 (other memory cells and gate regions are along the channel material structures 20d-f of FIG. 13; but such are out of the plane of FIG. 13 and not illustrated in FIG. 13). The memory cells 74 may be NAND memory cells of a three-dimensional NAND memory array. In some embodiments, the filled voids 19 may be considered to correspond to wordline levels of the three-dimensional NAND memory array.

In some embodiments, the insulative panels 70 may be utilized to subdivide the memory array amongst blocks, or at least partial blocks, (with a "block" corresponding to a collection of memory cells which are erased simultaneously in a block-erase operation).

The assemblies discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated structure. An assembly is formed to include a stack of alternating first and second levels. The first levels have insulative material, and the second levels have voids which extend horizontally. The assembly includes channel material structures extending through the stack. A first metal-containing material is deposited within the voids to partially fill the voids. The deposited first metal-containing material is etched to remove some of the first metal-containing material from within the partially-filled voids. Second metal-containing material is deposited to fill the voids.

Some embodiments include a method of forming an integrated structure. An assembly is formed to include a vertical stack of alternating first and second levels. The first levels are horizontally-extending insulative levels and comprise insulative material. The second levels are horizontally-extending voids between the insulative levels. The assembly includes channel material structures extending through the stack. the horizontally-extending voids weave around the channel material structures. the assembly includes slits extending through the stack. The horizontally-extending voids open into the slits. A first metal-containing material is deposited through the slits and into the horizontally-extending voids to partially fill the horizontally-extending voids.

some of the first metal-containing material is removed from within the horizontally-extending voids in regions adjacent the slits. Second metal-containing material is deposited to fill the horizontally-extending voids.

Some embodiments include a method of forming an integrated structure. An assembly is formed to include a vertical stack of alternating first and second levels. The first levels are horizontally-extending insulative levels and comprise insulative material. The second levels comprise voids between the insulative levels. The assembly includes channel material structures extending through the stack. The voids have peripheral regions lined with a conductive seed material. A first material is grown along the conductive seed material to partially fill the voids. The first material is etched to remove some of the first material from within the voids. Second material is grown over the first material to fill the voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated structure, comprising:
   providing a vertically-extending stack;
   forming first horizontally-extending voids in the stack, the first horizontally-extending voids are spaced from each other in the vertical direction;
   forming channel material structures through the stack;
   forming a first conductive material along a periphery of the first horizontally-extending voids creating second horizontally-extending voids; and
   forming a second conductive material within the second horizontally-extending voids.

2. The method of claim 1 further comprising removing some of the first conductive material before the forming of the second conductive material.

3. The method of claim 2 wherein the removing of some of the first conductive material comprises an etching processing step.

4. The method of claim 1 wherein the forming of the first conductive material comprises only partially filling the first horizontally-extending voids.

5. The method of claim 4 wherein the forming of the second conductive material comprises filling the second horizontally-extending voids.

6. The method of claim 1 wherein the forming of the first conductive material comprises growing the first conductive material.

7. The method of claim 1 wherein the forming of the second conductive material comprises growing the second conductive material.

8. The method of claim 1 wherein the first and second conductive materials comprise wordline levels of a three-dimensional NAND memory array.

9. The method of claim 1 wherein the first and second conductive materials comprise the same compositions.

10. The method of claim 1 wherein the first and second conductive materials comprise different compositions.

11. The method of claim 1 wherein the forming of the first and second conductive materials comprises depositing the first and second conductive materials.

12. The method of claim 11 wherein the depositing of each of the first and second conductive materials comprises one of the following deposition steps: ALD, CVD and PVD.

13. The method of claim 12 wherein the depositing of each of the first and second conductive materials comprises performing the same deposition step.

14. The method of claim 12 wherein the depositing of each of the first and second conductive materials comprises performing different deposition steps.

* * * * *